United States Patent
Pepi et al.

(10) Patent No.: US 6,735,514 B2
(45) Date of Patent: May 11, 2004

(54) CONTROL DEVICE FOR A VEHICLE ENGINE

(75) Inventors: Alessandro Pepi, Brescia (IT); Saverio Pezzini, Vimercate (IT); Paolo Marceca, Bologna (IT); Alberto Ferrari, Camposanto (IT)

(73) Assignees: STMicroelectronics S.r.l., Agrate Brianza (IT); Magneti Marelli S.p.A., Turin (IT)

( * ) Notice: Subject to any disclaimer, the term of this patent is extended or adjusted under 35 U.S.C. 154(b) by 100 days.

(21) Appl. No.: 09/977,563

(22) Filed: Oct. 15, 2001

(65) Prior Publication Data

US 2002/0089883 A1 Jul. 11, 2002

(30) Foreign Application Priority Data

Oct. 16, 2000 (WO) ............................... PCT/IT00/00412
Jan. 24, 2001 (EP) ................................. 01101520

(51) Int. Cl.[7] ............................................. G06F 19/00
(52) U.S. Cl. ................. 701/114; 701/115; 123/406.33; 702/31
(58) Field of Search ............................... 701/114, 115, 701/35, 29, 31; 702/31; 123/406.12, 406.13, 406.18, 406.33, 674, 480, 486, 339.2

(56) References Cited

U.S. PATENT DOCUMENTS

| | | | |
|---|---|---|---|
| 4,556,943 A | * 12/1985 | Pauwels et al. | ............. 701/115 |
| 5,033,010 A | * 7/1991 | Lawrence et al. | ............. 701/35 |
| 5,126,944 A | * 6/1992 | Sakuma et al. | ............. 701/103 |
| 5,446,665 A | * 8/1995 | Adrian et al. | ............. 701/102 |
| 5,802,480 A | * 9/1998 | Shiraishi | ............. 701/45 |
| 5,964,813 A | * 10/1999 | Ishii et al. | ............. 701/35 |
| 6,356,823 B1 | * 3/2002 | Iannotti et al. | ............. 701/35 |

* cited by examiner

Primary Examiner—Willis R. Wolfe
Assistant Examiner—Johnny H. Hoang
(74) Attorney, Agent, or Firm—Lisa K. Jorgenson; Allen, Dyer, Doppelt, Milbrath & Gilchrist, P.A.

(57) ABSTRACT

A control device for a vehicle engine includes a memory unit for storing engine configuration parameters, a processing unit for sending control signals to the engine in accordance with the configuration parameters, and an input/output unit connectible to an external computer to modify the configuration parameters. The control device includes a first portion and a second portion of the memory unit, with each portion being alternately used in an active state for storing a current version of the configuration parameters or in an inactive state for the writing of a new version of the configuration parameters. The processing unit accesses the portion which is in the active state for reading, and the input/output unit accesses the portion which is in the inactive state for writing. An interconnection unit selectively switches one of the portions to the active state and the other of the portions to the inactive state.

32 Claims, 2 Drawing Sheets

CONTROL DEVICE FOR A VEHICLE ENGINE

FIELD OF THE INVENTION

The present invention relates to the field of electronics, and in particular, to a control device for a vehicle engine.

BACKGROUND OF THE INVENTION

Engines of modern vehicles, such as automobiles, for example, have various electronic systems which enable their operation to be controlled in the best possible manner. These systems are controlled by a device which sends corresponding control signals to the engine in accordance with configuration parameters stored in a non-volatile memory of the control device. The memory is typically a flash EEPROM.

During an operation to calibrate the control device, the configuration parameters are corrected to modify operation of the engine. This calibration operation is typically performed in the factory at the vehicle development stage or in the workshop, to adapt operation of the engine to various environmental conditions or to the deterioration of the components.

The calibration operation is generally performed in the field while the engine is in operation in order to check directly the results of the modifications applied. For this purpose, the control device is connected to an external computer which controls the modification of the configuration parameters read from the flash memory of the control device. However, the configuration parameters cannot be modified in real time directly in the flash memory of the control device. The writing operation in fact involves the need to cancel the contents of the flash memory at least in blocks, and the configuration parameters are therefore not available at the same time for controlling operation of the engine.

A known approach includes using a specially constructed or custom interface card which is connected to the control device by a high-speed parallel bus. The external computer is then connected to the interface card by a standard connector. During the calibration operation, at least some of the memory space of the control device associated with the configuration parameters is re-mapped in a working memory (RAM) of the interface card. The configuration parameters can thus be modified directly by the external computer by a standard connection while, at the same time, being used by the control device. Upon completion of the calibration operation, the new configuration parameters are then downloaded from the RAM memory of the interface card into the flash memory of the control device.

However, this approach is very expensive because of the low production volumes of the configuration cards, and of the need to increase the number of external connection terminals of the control device to permit real-time access to the configuration parameters downloaded to the RAM of the interface card. In particular, in applications with high operating frequencies, the external connection between the control device and the RAM of the interface card slows down access to the configuration parameters so that the control device cannot be calibrated in the field with performance identical to its actual performance.

SUMMARY OF THE INVENTION

In view of the foregoing background, an object of the present invention is to prevent the above mentioned problems.

This and other objects, advantages and features according to the present invention are provided by a control device for a vehicle engine comprising a memory unit for storing engine configuration parameters, a processing unit for sending control signals to the engine in accordance with the configuration parameters, and an input/output unit connectible to an external computer to modify the configuration parameters.

The control device may further include a first portion and a second portion of the memory unit, with each portion being alternately used in an active state for storing a current version of the configuration parameters, or in an inactive state for the writing of a new version of the configuration parameters. The processing unit may access the portion which is in the active state for reading, and the input/out unit may access the portion which is in the inactive state for writing. Means are provided for selectively switching one of the portions to the active state and the other of the portions to the inactive state.

Moreover, the invention is also directed to a vehicle comprising the control device and a corresponding control method.

BRIEF DESCRIPTION OF THE DRAWINGS

Further characteristics and advantages of the present invention will become clear from the following description of a preferred embodiment thereof, provided by way of a non-limiting example with reference to the appended drawings, in which.

DETAILED DESCRIPTION OF THE PREFERRED EMBODIMENTS

Figure 1:
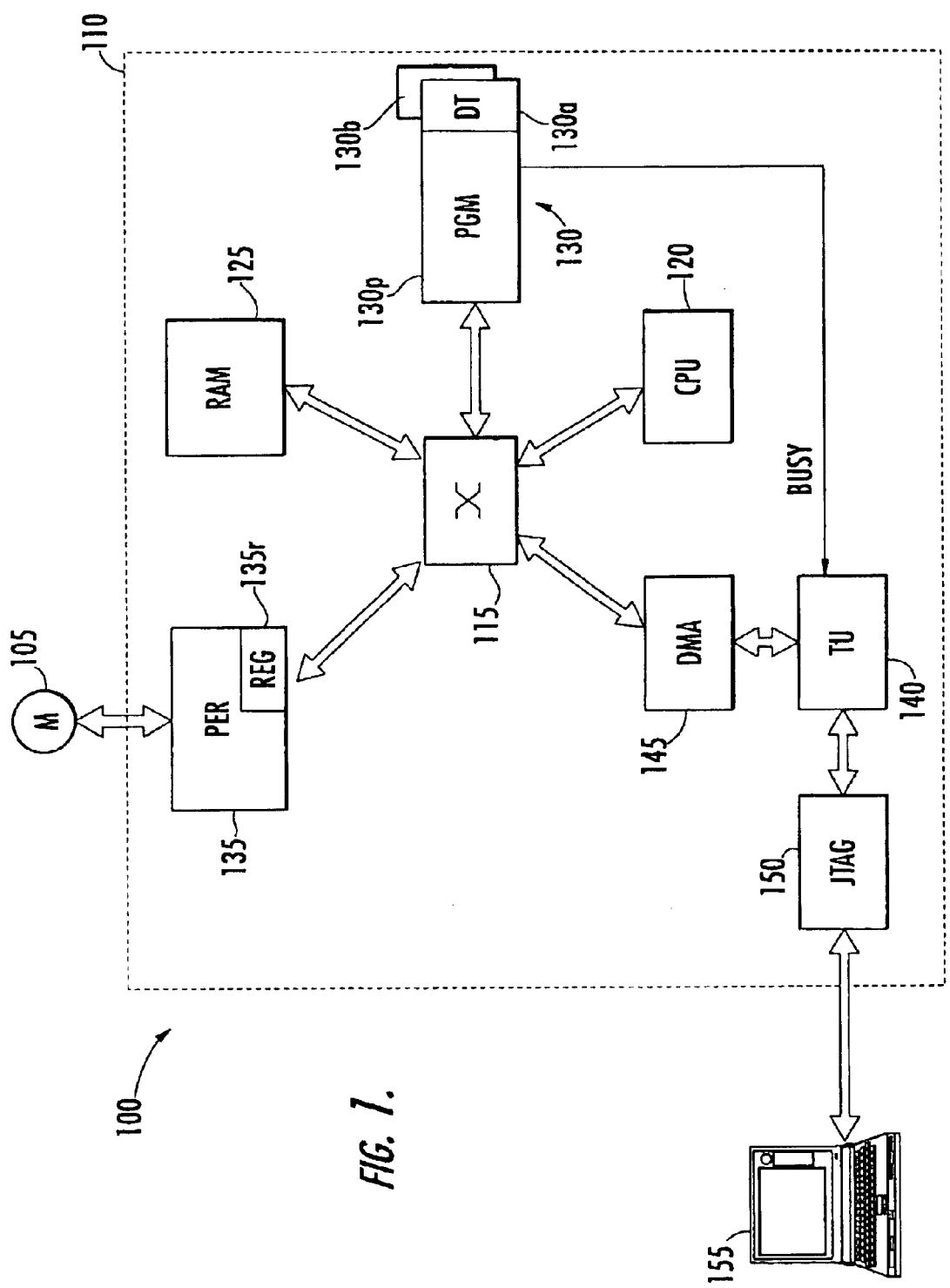
FIG. 1 is a basic block diagram of a vehicle provided with a control device according to the present invention.

With reference in particular to FIG. 1, a motor vehicle 100 has an engine 105. Operation of the engine 105 is managed by a control device 110 which controls, for example, electronic injection, engine timing, and the like. The control device 110 is formed by various units which are connected selectively in pairs by an interconnection unit or cross-bar 115. In detail, a central processing unit (CPU) 120 manages operation of the control device 110, a working memory (RAM) 125 is used directly by the CPU 120, and a non-volatile memory 130 contains programs and data for operation of the CPU 120.

The memory 130, which is produced in integrated form on a single chip of semiconductor material, is formed by a flash EEPROM memory which is erasable and reprogrammable in blocks. The flash memory 130 is a read while write memory so that it is possible to erase and reprogram one block while data is read from another block.

The flash memory 130 stores a control program for the CPU 120 and configuration parameters of the engine 105, which is typically organized in vectors and matrices of coherent data, that is, data relating as a whole to the control of a particular function of the motor. In particular, the program (PGM) is stored in a dedicated portion 130p of the flash memory 130. The flash memory 130 includes two additional portions 130a and 130b. Each portion 130a, 130b alternately is used in an active state for storing a current version of the configuration parameters read by the program executed by the CPU 120, or in an inactive state for the writing of a new version of the configuration parameters.

A series of peripheral units 135 is also connected to the interconnection unit 115. The peripheral units 135 include, for example, actuators for the regulation of the engine 105 or sensors for measuring operating parameters thereof. Some of the peripheral units 135, such as the actuators, have internal registers 135r which enable their operation to be regulated.

The control device 110 also includes a calibration unit (TU) 140 connected to a direct memory access (DMA) controller 145 which is directly connected to the interconnection unit 115. A dedicated line is used to send, from the flash memory 130 to the calibration unit 140, a busy signal indicating a writing operation is in progress in the flash memory 130. The calibration unit 140 also communicates with an interface 150, for example, of the JTAG (Joint Test Access Group) type commonly used for testing the control device 110 and for periodic checking of its functionality. An external computer, such as a portable laptop computer 155, for example, is connected to the control device 110 by a cable terminating in a PCMCIA connector inserted in a corresponding port associated with the JTAG interface 150.

The JTAG interface 150 includes a control logic unit which manages the serial transfer of data with one or more shift registers. In particular, the JTAG interface provides a line JTDI for receiving input binary data (bit), a line JTDO for sending an output bit, a line JTTMS for selecting a test mode, an initialization (reset) line JTRST, and a line JTCLK for sending a dedicated clock signal.

When the interface JTAG 150 is activated by the selection signal JTTMS, upon each leading edge of the clock signal JTCLK, the bit input on the line JTDI is recognized (strobed) and, upon each trailing edge of the clock signal JTCLK, a bit is output on the line JTDO. It is thus possible with a series or a burst of pulses of the clock signal JTCLK to send to the control device 110 a series or a string of bits which are loaded, in a serial manner, into the shift register of the interface JTAG 150. Communication between the external computer 155 and the control device 100 is managed in a logical manner by a protocol, for example, of the Nexus type as defined by the IEEE Standard 1149.1.

Both the CPU 120 and the DMA controller 145 operate in a master mode for controlling access to the interconnection resources of the interconnection unit 115 within which there is an arbitrator which manages mutually exclusive access to the resources. The CPU 120 and the DMA controller 145 have access to a memory space which is mapped in all of the resources of the control device 110, such as the flash memory 130, the RAM memory 125, and the internal registers of the various units. In particular, the portion of the memory space which is dedicated to the current version of the configuration parameters, i.e., the current data space, is normally used by the CPU 120, whereas the portion of the memory space which is dedicated to the new version of the configuration parameters, i.e., data space being modified, is normally used by the DMA controller 145.

During a normal operation of the control device 110, i.e., during which the external computer 155 is not connected, the control program of the CPU 120 accesses the current version of the configuration parameters stored in one of the data portions 130a, 130b which is in the active state, such as data portion 130a, for example. The CPU 120 therefore controls the peripheral units 135 for sending corresponding control signals to the engine 105.

At the same time, the CPU 120 can interrogate or poll the peripheral units 135 periodically, for example, every hour, to measure operating parameters of the engine 105. The operating parameters read are written in the other data portion of the flash memory 130 which is in the inactive state, i.e., the portion 130b in the illustrated example.

As soon as the external computer 155 is connected to the JTAG interface 150, a corresponding interrupt signal, for example, is sent to the CPU 120. The CPU 120 consequently interrupts the storage of the operating parameters of the engine 105 in the data portion 130b which is in the inactive state. This is done while the reading of the configuration parameters from the portion 130a which is in the active state proceeds normally.

The external computer 155 can thus load a command to read the operating parameters of the engine 105 into the shift register of the JTAG interface 150. This read command is then supplied to the calibration unit 140 directly by the DMA controller 145. The calibration unit 140 manages reading of the data portion 130b which is in the inactive state. The configuration parameters of the engine thus read are then supplied to the external computer 155 by the JTAG interface 150.

During an operation to calibrate the control device 110, the current version of the configuration parameters is downloaded to the external computer 155 in a similar manner from the data portion 130a which is in the active state. The configuration parameters are modified in the external computer 155. The external computer 155 then loads a command to write a new configuration parameter in the shift register of the interface JTAG 150. The write command is then supplied to the calibration unit 140 directly by the DMA controller 145. The calibration unit 140 manages the writing of the data portion 130b which is in the inactive state. In the course of the operation to write the new configuration parameter, the flash memory 130 activates the busy signal. The calibration unit 140 does not accept any subsequent command to write the flash memory until the writing operation in progress is completed, i.e, the busy signal is cancelled.

Once the updating of the new configuration parameters in the data portion 130b which is in the inactive state is completed, the external computer 155 sends a corresponding writing completed signal to the calibration unit 140 by the JTAG interface 150. As described in detail below, the states of the data portions 130a and 130b are consequently reversed. In the illustrated example, the data portion 130a switches to the inactive state and the data portion 130b switches to the active state. The management program of the CPU 120 thus automatically accesses the new version of the configuration parameters stored in the data portion 130b while the other data portion 130a becomes available for further modification.

The external computer 155 can also load a command to read the registers 135r into the shift register of the JTAG interface 150. This read command is then supplied to the calibration unit 140 which manages the reading of the registers 135b directly by the DMA controller 145. The values thus read are then supplied to the external computer 155 by the JTAG interface 150.

Similar considerations apply if the control device 110 is used in a vehicle of a different type (e.g., a motorcycle), or has a different structure (e.g., the various units are connected in parallel to a bus). Other considerations include if the external computer is of a different type (e.g., a laptop computer), if it is connected to the control device by a connector of another type (e.g., a RJ45 type connector), or if the communication between the external computer and the control device uses a different protocol.

Figure 2:
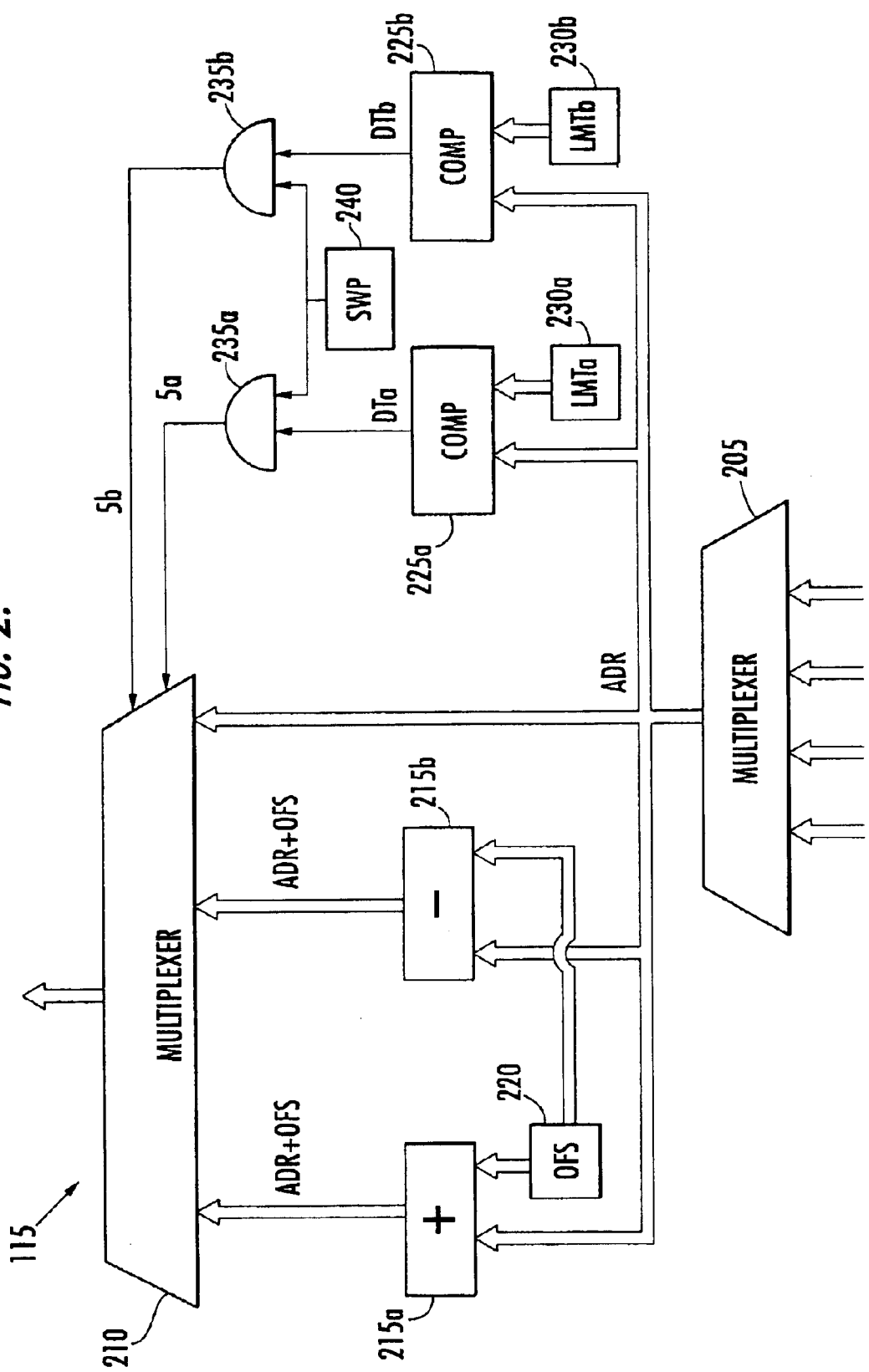
FIG. 2 shows in greater detail an interconnection unit within the control device illustrated in FIG. 1.

With reference now to FIG. 2, the interconnection unit 115 associated with a port for connection to the flash memory is illustrated in greater detail. The interconnection unit 115 includes a multiplexer 205 having four inputs each of which is connected to one of the other connection ports of the interconnection unit 115. These connection ports are associated with the CPU 120, the RAM memory 125, the peripheral units 135 and the DMA controller 145. The multiplexer 205 receives an address transmitted by the CPU 120 or by the DMA controller 145 to the respective connection port.

The multiplexer 205 transmits this address (ADR) as an output based upon on a selection signal generated by the arbitrator of the interconnection unit 115. An additional multiplexer 210 has three inputs connected, respectively, to an output of the multiplexer 205, to an output of an adder 215a, and to an output of a subtractor 215b. The signal output by the multiplexer 210 is transferred to the port for connection to the flash memory. The adder 215a and the subtractor 215b receive, at respective inputs, the address ADR and an offset value OFS stored in a register 220. The offset valve OFS is equal to the difference between a first address of the data space being modified and a first address of the current data space.

The address ADR is also supplied to a first input of a comparator 225a, and a second input of this comparator receives a signal (LMTa) stored in a register 230a. Similarly, the address ADR is supplied to a first input of another comparator 225b, and a second input of this comparator receives a signal (LMTb) stored in another register 230b. The signal LMTa and the signal LMTb respectively define the limits of the current data space and the limits of the data space being modified.

The comparator 225a outputs a bit DTa indicating that the address ADR falls within the limits of the current data space. The comparator 225b outputs a bit DTb indicating that the address ADR falls within the limits of the data space being modified. The bit DTa and the bit DTb are supplied, respectively, to a first input of an AND logic gate 235a and to a first input of an AND logic gate 235b. The AND gates 235a and 235b receive, at respective second inputs, a flag SWP for inverting the memory mapping of the current data space and of the data space being modified. The AND gate 235a outputs a bit Sa and the AND gate outputs a bit Sb, and these are applied to respective selection inputs of the multiplexer 210.

Each time an address ADR has to be transmitted from a unit of the control device 110 (the CPU 120, the RAM memory 125, the peripheral units 135, or the DMA controller 145) to the flash memory 130, this value is compared by the comparators 225a and 225b with the limits of the current data space and with the limits of the data space being modified, respectively. If the address ADR does not fall within any of these limits (for example, because it relates to an instruction of the control program of the CPU), both of the bits DTa and DTb are cancelled (logic level 0) so that both of the bits Sa and Sb are also cancelled irrespective of the value of the flag SWP. The combination Sa,Sb=00 transfers the address ADR as an output to the multiplexer 210 so that the flash memory 130 can be accessed normally.

If, however, the address ADR falls, for example, within the limits of the current data space, the corresponding bit Dta is set at logic level 1 while the bit Dtb is cancelled. Upon the assumption that the flag SWP is cancelled, the bits Sa, Sb also adopt the value 00 in this case so that the address ADR is transferred as an output to the multiplexer 210 to access a corresponding location of a predetermined one of the data portions of the flash memory 130. For example, the first portion indicated as 130a in FIG. 1 may be accessed.

If, however, the flag SWP is activated, the bit Sa adopts the value 1. The combination Sa, Sb=10 transfers the value ADR+OFS generated by the adder 215a as an output to the multiplexer 210. A corresponding location of the other data portion of the flash memory 130 is thus accessed, i.e., the portion indicated 130b in FIG. 1 in the illustrated example. Complementary considerations apply if the address ADR falls within the limits of the data space being modified. This is with the combination Sa, Sb=01 which transfers the value ADR-OFS generated by the subtractor 215b as an output to the multiplexer 210 when the address ADR falls within the limits of the space being modified and SWP=1.

The registers 220, 230a, 230b and 240 are set in response to an initialization or reset command. Each time the calibration unit 140 receives a writing completed signal from the external computer 155, it sends an interrupt signal to the CPU 120. The CPU 120 consequently performs a service routine which inverts the value of the flag SWP stored in the register 240 for switching the states of the flash memory data portions. The interrupt signal is preferably masked by the management program of the CPU 120 during an operation to read a coherent data structure to be used only when all of the configuration parameters of the structure have been read.

Similar considerations apply if the interconnection unit 115 has a different structure, and if the functions described above are performed by other circuit components (possibly external the interconnection unit 115), and the like.

More generally, the control device 110 includes a first portion and a second portion of the memory unit, each of which can be alternately used in an active state for storing a current version of the configuration parameters or in an inactive state. The following may be performed in the inactive state: the writing of a new version of the configuration parameters, the processing unit accessing the portion which is in the active state for reading, and the input/output unit accessing the portion which is in the inactive state for writing, and for selectively switching one of the portions to the active state and the other of the portions to the inactive state.

This approach is particularly economical since it does not require the provision of any specially constructed components for the calibration operation 140. Moreover, the configuration data is accessed by the CPU 120 directly in the flash memory 130, even during the calibration operation. The performance of the control device is consequently substantially identical to its actual performance, even during calibration operations in the field. This result is achieved with a negligible increase in the size of the flash memory 130 since the configuration parameters are only a very small part of the information stored therein.

The preferred embodiment of the present invention described above offers further advantages. In particular, the use of two banks of a single read-while-write flash memory (for storing the current version and the new version of the configuration parameters) achieves a particularly compact structure with a single memory and respective control circuits.

The use of a current data space and of a data space being modified, which are alternately mapped in different portions of the flash memory 130 renders the switching mechanism completely transparent to the CPU 120. The management of the switching of the states of the portions of the flash memory 130 by interruption is particularly quick and easy.

The masking of the interrupt signal during the reading of a coherent data structure also ensures that the operating parameters used by the control device 110 are modified only at safe moments to ensure correct operation of the engine 105.

The busy signal sent by the flash memory 130 to the calibration unit 140 enables operation of the external computer 155 to be synchronized with the flash memory 130 without slowing down the operation of the control device 110 in any way.

Similar considerations apply if a different mechanism is used for mapping the current version and the new version of the configuration parameters in the two data portions. For example, a different mechanism includes simultaneously sending each address to the two data portions and alternately enabling one of the data portions by the flag SWP. The approach of the present invention may, however, also be implemented with two separate flash memories, with hardware switching the states of the data portions (by two signals) without any control on the timing of the switching. The external computer 155 and the flash memory are synchronized by a flag within the flash memory which is indicative of the completion of the writing operation and is interrogated periodically by the calibration unit 140, and the like.

The writing of the operating parameters of the engine 105 in the data portion which is in the inactive state enables this portion of the flash memory (which is normally not used during the normal operation of the control device) to be utilized for diagnostic functions or for the collection of information during endurance tests. The fact that the internal registers 135r of the various peripheral 135 units can be modified directly by the external computer 155 renders the structure particularly flexible. For example, this enables the operation of the actuators to be regulated very easily.

The use of the JTAG interface 150 enables functions already present in the control device 110 to be utilized and does not require the addition of any new external connection terminals. Moreover, this enables the external computer 155 to be connected to the control device 110 by standard connectors. The calibration unit 140 with the respective DMA controller renders the writing of the new configuration parameters completely transparent to the external computer 155. This result is achieved independently of the CPU 120, with negligible slowing of the operation of the control device 110 due to any conflict with the CPU 120 accessing the interconnection unit 115.

Similar considerations apply if a different serial test interface is used. Alternatively, the calibration unit 140 is not of the master type and the writing of the new configuration parameters in the flash memory 130 is controlled directly by the CPU 120. The control device 110 may also provide for a different input/output unit for connection to the external computer 155 with a dedicated interface and respective additional connection terminals, and the like.

In order to satisfy contingent and specific requirements, a person skilled in the art may apply to the above described approach many modifications and variations all of which, however, are included within the scope of the invention as defined by the appended claims.

That which is claimed is:

1. A control device for a vehicle engine comprising:
    a memory unit for storing engine configuration parameters, and comprising first and second memory portions being alternately used in an active state for storing a current version of the engine configuration parameters and in an inactive state for storing a new version of the engine configuration parameters;
    a processing unit for sending control signals to the engine based upon the engine configuration parameters, and for accessing one of said first and second memory portions in the active state for reading the current version of the engine configuration parameters therefrom; and
    an input/output unit connectable to an external device for modifying the engine configuration parameters, and for accessing one of said first and second memory portions in the inactive state for writing the new version of the engine configuration parameters thereto.

2. A control device according to claim 1, wherein said memory unit comprises a EEPROM memory comprising first and second banks of memory cells, and wherein said first memory portion includes the first bank of memory cells and said second memory portion includes the second bank of memory cells.

3. A control device according to claim 1, further comprising switching means for selectively switching one of said first and second memory portions to the active state and switching the other memory portion to the inactive state.

4. A control device according to claim 3, wherein the current version of the engine configuration parameters is accessed by said processing unit based upon a first location of addresses, and the new version of the engine configuration parameters is accessed by said input/output unit based upon a second location of address; and wherein said switching means comprises:
    an indicator for indicating a state of said first and second memory portions; and
    means for associating with each address of the first and second locations a corresponding location of said first and second memory portions based upon the respective states.

5. A control device according to claim 4, wherein said input/output unit sends an interrupt signal to said processing unit after the new version of the engine configuration parameters has been written to one of said first and second memory portions in the inactive state, and wherein said processing unit switches said indicator in response to the interrupt signal.

6. A control device according to claim 5, wherein the engine configuration parameters are organized into data structures which cannot be modified during a reading operation, and wherein the interrupt signal is masked during the reading operation.

7. A control device according to claim 1, further comprising a dedicated connection path between said memory unit and said input/output unit, wherein said memory unit provides a completion signal to said input/output unit via the dedicated connection path indicating completion of a writing operation, and wherein said input/output unit accepts a writing command from the external device if the completion signal is activated.

8. A control device according to claim 1, wherein said processing unit and said input/output unit are activated in response to a request signal from the external device.

9. A control device according to claim 1, further comprising at least one peripheral unit comprising an internal register for interfacing with the engine, and wherein said input/output unit modifies data in said register in response to a request signal from the external device.

10. A control device according to claim 9, wherein said input/output unit comprises:
    a test interface for exchanging information with the external device; and a processor for accessing at least one of said memory unit and said at least one peripheral unit independently of said processing unit.

11. A control device for a vehicle engine comprising:

a EEPROM for storing engine configuration parameters, and comprising first and second memory portions being alternately used in an active state for storing a current version of the engine configuration parameters and in an inactive state for storing a new version of the engine configuration parameters;

a processing unit for sending control signals to the engine based upon the engine configuration parameters, and for accessing one of said first and second memory portions in the active state for reading the current version of the engine configuration parameters therefrom;

an input/output unit connectable to an external device for modifying the engine configuration parameters, and for accessing one of said first and second memory portions in the inactive state for writing the new version of the engine configuration parameters thereto; and switching means for selectively switching one of said first and second memory portions to the active state and switching the other memory portion to the inactive state.

12. A control device according to claim 11, wherein said EEPROM comprises first and second banks of memory cells, and wherein said first memory portion includes the first bank of memory cells and said second memory portion includes the second bank of memory cells.

13. A control device according to claim 11, wherein the current version of the engine configuration parameters is accessed by said processing unit based upon a first location of addresses, and the new version of the engine configuration parameters is accessed by said input/output unit based upon a second location of address; and wherein said switching means comprises:

an indicator for indicating a state of said first and second memory portions; and means for associating with each address of the first and second locations a corresponding location of said first and second memory portions based upon the respective states.

14. A control device according to claim 13, wherein said input/output unit sends an interrupt signal to said processing unit after the new version of the engine configuration parameters has been written to one of said first and second memory portions in the inactive state, and wherein said processing unit switches said indicator in response to the interrupt signal.

15. A control device according to claim 14, wherein the engine configuration parameters are organized into data structures which cannot be modified during a reading operation, and wherein the interrupt signal is masked during the reading operation.

16. A control device according to claim 11, further comprising at least one peripheral unit comprising an internal register for interfacing with the engine, and wherein said input/output unit modifies data in said register in response to a request signal from the external device.

17. A vehicle comprising:

an engine; and a control device connected to said engine and comprising a memory unit for storing engine configuration parameters, and comprising first and second memory portions being alternately used in an active state for storing a current version of the engine configuration parameters and in an inactive state for storing a new version of the engine configuration parameters, a processing unit for sending control signals to the engine based upon the engine configuration parameters, and for accessing one of said first and second memory portions in the active state for reading the current version of the engine configuration parameters therefrom, and an input/output unit connectable to an external device for modifying the engine configuration parameters, and for accessing one of said first and second memory portions in the inactive state for writing the new version of the engine configuration parameters thereto.

18. A vehicle according to claim 17, wherein said memory unit comprises a EEPROM memory comprising first and second banks of memory cells, and wherein said first memory portion includes the first bank of memory cells and said second memory portion includes the second bank of memory cells.

19. A vehicle according to claim 17, wherein said control device further comprises an interconnection unit for selectively switching one of said first and second memory portions to the active state and switching the other memory portion to the inactive state.

20. A vehicle according to claim 19, wherein the current version of the engine configuration parameters is accessed by said processing unit based upon a first location of addresses, and the new version of the engine configuration parameters is accessed by said input/output unit based upon a second location of address; and wherein said interconnection unit comprises:

an indicator for indicating a state of said first and second memory portions; and at least one multiplexer for associating with each address of the first and second locations a corresponding location of said first and second memory portions based upon the respective states.

21. A vehicle according to claim 20, wherein said input/output unit sends an interrupt signal to said processing unit after the new version of the engine configuration parameters has been written to one of said first and second memory portions in the inactive state, and wherein said processing unit switches said indicator in response to the interrupt signal.

22. A vehicle according to claim 17, wherein said control device further comprises at least one peripheral unit comprising an internal register for interfacing with said engine, and wherein said input/output unit modifies data in said register in response to a request signal from the external device.

23. A vehicle according to claim 22, wherein said input/output unit comprises:

a test interface for exchanging information with the external device; and a processor for accessing at least one of said memory unit and said at least one peripheral unit independently of said processing unit.

24. A method for controlling a vehicle engine comprising:

storing engine configuration parameters in a memory unit comprising first and second memory portions being alternately used in an active state for storing a current version of the engine configuration parameters and in an inactive state for storing a new version of the engine configuration parameters;

sending control signals from a processing unit to the vehicle engine based upon the engine configuration parameters, with the processing unit accessing one of the first and second memory portions in the active state for reading the current version of the engine configuration parameters therefrom; and modifying the engine configuration parameters using an input/output unit connectable to an external device, the input/output unit accessing one of the first and second memory portions in the inactive state for writing the new version of the engine configuration parameters thereto.

25. A method according to claim 24, further comprising selectively switching one of the first and second memory portions to the active state and switching the other memory portion to the inactive state.

26. A method according to claim 24, wherein the memory unit comprises a EEPROM memory comprising first and second banks of memory cells, and wherein the first memory portion includes the first bank of memory cells and the second memory portion includes the second bank of memory cells.

27. A method according to claim 24, wherein the current version of the engine configuration parameters is accessed by the processing unit based upon a first location of addresses, and the new version of the engine configuration parameters is accessed by the input/output unit based upon a second location of address.

28. A method according to claim 27, further comprising:
indicating a state of the first and second memory portions; and associating with each address of the first and second locations a corresponding location of the first and second memory portions based upon the respective states.

29. A method according to claim 28, further comprising:

sending an interrupt signal from the input/output unit to the processing unit after the new version of the engine configuration parameters has been written to one of the first and second memory portions in the inactive state; and switching the state of the first and second memory portions in response to the interrupt signal.

30. A method according to claim 29, wherein the engine configuration parameters are organized into data structures which cannot be modified during a reading operation, and further comprising masking the interrupt signal during the reading operation.

31. A method according to claim 24, further comprising:

providing a completion signal from the memory unit to the input/output unit via a dedicated connection path therebetween indicating completion of a writing operation; and accepting a writing command by the input/output unit from the external device if the completion signal is activated.

32. A method according to claim 24, further comprising:

interfacing the engine with at least one peripheral unit comprising at least one internal register storing data; and modifying the data in the at least one register in response to a request signal from the external device.

* * * * *

UNITED STATES PATENT AND TRADEMARK OFFICE
CERTIFICATE OF CORRECTION

PATENT NO.   : 6,735,514 B2
DATED        : May 11, 2004
INVENTOR(S)  : Pepi et al.

It is certified that error appears in the above-identified patent and that said Letters Patent is hereby corrected as shown below:

Title page,
Item [73], Assignee, delete "STMicroelectronics S.r.l., Agrate Brianza (IT); Magneti Marelli S.p.A., Turin (IT)" insert -- STMicroelectronics S.r.l., Agrate Brianza (IT); Magneti Marelli Powertrain S.p.A., Torino, (IT) --

Signed and Sealed this

Twenty-seventh Day of July, 2004

JON W. DUDAS
*Acting Director of the United States Patent and Trademark Office*